United States Patent [19]

Carl et al.

[11] Patent Number: 5,468,687
[45] Date of Patent: Nov. 21, 1995

[54] METHOD OF MAKING $Ta_2O_5$ THIN FILM BY LOW TEMPERATURE OZONE PLASMA ANNEALING (OXIDATION)

[75] Inventors: Dan Carl, Mountainview, Calif.; David M. Dobuzinsky; Son V. Nguyen, both of Hopewell Junction, N.Y.; Tue Nguyen, Vancouver, Wash.

[73] Assignee: International Business Machines Corporation, Armonk, N.Y.

[21] Appl. No.: 281,399

[22] Filed: Jul. 27, 1994

[51] Int. Cl.[6] .................................................. H01L 21/70
[52] U.S. Cl. ........................... 437/235; 437/60; 437/919; 437/242
[58] Field of Search .............................. 437/60, 235, 241, 437/919, 978, 247, 47, 52, 242, 978

[56] References Cited

U.S. PATENT DOCUMENTS

| | | | |
|---|---|---|---|
| 4,891,682 | 1/1990 | Nishiok et al. | 357/54 |
| 5,079,191 | 1/1992 | Shiwuki et al. | 437/235 |
| 5,142,438 | 8/1992 | Reinber et al. | 437/52 |
| 5,234,556 | 8/1993 | Oishi et al. | 427/567 |
| 5,316,982 | 5/1994 | Taniguchi | 437/236 |
| 5,330,935 | 7/1994 | Dobuzinsky et al. | 437/239 |
| 5,352,623 | 10/1994 | Kamiyama | 437/60 |
| 5,362,632 | 11/1994 | Matuewe | 437/60 |

FOREIGN PATENT DOCUMENTS

| | | |
|---|---|---|
| 05221644 | 8/1993 | Japan . |
| 6-21333 | 6/1994 | Japan . |

*Primary Examiner*—Olik Chaudhuri
*Assistant Examiner*—S. Mulpuri
*Attorney, Agent, or Firm*—Whitham, Curtis, Whitham & McGinn; Eric W. Peteraske

[57] ABSTRACT

A method for low temperature annealing (oxidation) of high dielectric constant $Ta_2O_5$ thin films uses an ozone enhanced plasma. The films produced are especially applicable to 64 and 256 Mbit DRAM applications. The ozone enhanced plasma annealing process for thin film $Ta_2O_5$ reduces the processing temperature to 400° C. and achieves comparable film quality, making the $Ta_2O_5$ films more suitable for Ultra-Large Scale Integration (ULSI) applications (storage dielectric for 64 and 256 Megabit DRAMs with stack capacitor structures, etc.) or others that require low temperature processing. This low temperature process is extendable to other high dc and piezoelectric thin films which may have many other applications.

5 Claims, 4 Drawing Sheets

5,468,687

METHOD OF MAKING $Ta_2O_5$ THIN FILM BY LOW TEMPERATURE OZONE PLASMA ANNEALING (OXIDATION)

BACKGROUND OF THE INVENTION

1. Field of the Invention

The present invention generally relates to a method of producing high dielectric constant materials on a semiconductor substrate and, more particularly, to a method of improving the quality of tantalum pentoxide ($Ta_2O_5$) films with low temperature annealing.

2. Description of the Prior Art

High dielectric constant (dc) materials are useful as capacitor dielectrics of the storage capacitor in dynamic random access memories (DRAMs). High dc $Ta_2O_5$ film has been seriously studied as a storage capacitor dielectric for 64 and 256 Mbit dynamic random access memories (DRAMs), especially for stack capacitor structures. Most of these films are deposited at low temperature (i.e., 400°–480° C.) using chemical vapor deposition (CVD). However, the primary disadvantage of $Ta_2O_5$ as compared to insulators with lower dielectric constants is its fairly high conductivity with substantial current leakage due to either deviation from stoichiometric composition or defective bonding. Therefore, $Ta_2O_5$ films require substantially a higher temperature (i.e., 750°–800° C.) annealing cycle to improve the film's electrical properties. One method is Rapid Thermal Oxidation (RTO). The high temperatures used in this method may cause oxidation of nearby polysilicon, degrading the dielectric properties. Another method used is ultraviolet (UV) ozone in which samples are exposed to UV light under ozone ambient. UV ozone has a long processing time and may also cause high temperatures locally. Ozone plasma has been studied as a "low temperature plasma oxidation process" to grow excellent thin silicon oxide film. However, the use of plasma oxidation to improve other high dielectric constant materials has not been done.

SUMMARY OF THE INVENTION

It is therefore an object of the present invention to provide a method of decreasing the leakage normally associated with CVD deposited $Ta_2O_5$ films.

It is another object of the present invention to provide shorter processing time of $Ta_2O_5$ films more suitable with single wafer process integration.

According to the invention, a method is provided for low temperature ozone plasma annealing (oxidation) of high dielectric constant $Ta_2O_5$ thin films. The films produced are especially applicable to 64 and 256 Mbit DRAM applications.

The ozone plasma annealing process according to the invention for thin film $Ta_2O_5$ reduces the processing temperature to 400° C. and achieves comparable film quality, making the $Ta_2O_5$ films more suitable for Ultra-Large Scale Integration (ULSI) applications (as storage dielectric for 64 and 256 Megabit DRAMs with stack capacitor structures, etc.) or others that require low temperature processing. This low temperature process is extendable to other high dc and piezoelectric thin films which may have many other applications.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The process of the present invention improves the $Ta_2O_5$ film's properties, providing low leakage and high electrical breakdown, by a plasma oxidation annealing process with much shorter processing time. Plasma annealing is more effective at lower temperature. This is due to the more effective oxidation mechanism by ozone plasma as compared with regular UV ozone annealing. In ozone plasma, the ozone concentration is much higher due to the continuous recombination and generation of ozone by ions and radicals in the plasma discharge. Furthermore, the oxygen ions and radicals in ozone plasma also assist the oxidation and improve leakage and breakdown of the $Ta_2O_5$ film. This makes the ozone plasma oxidation/annealing process superior to UV ozone annealing.

Figure 1:
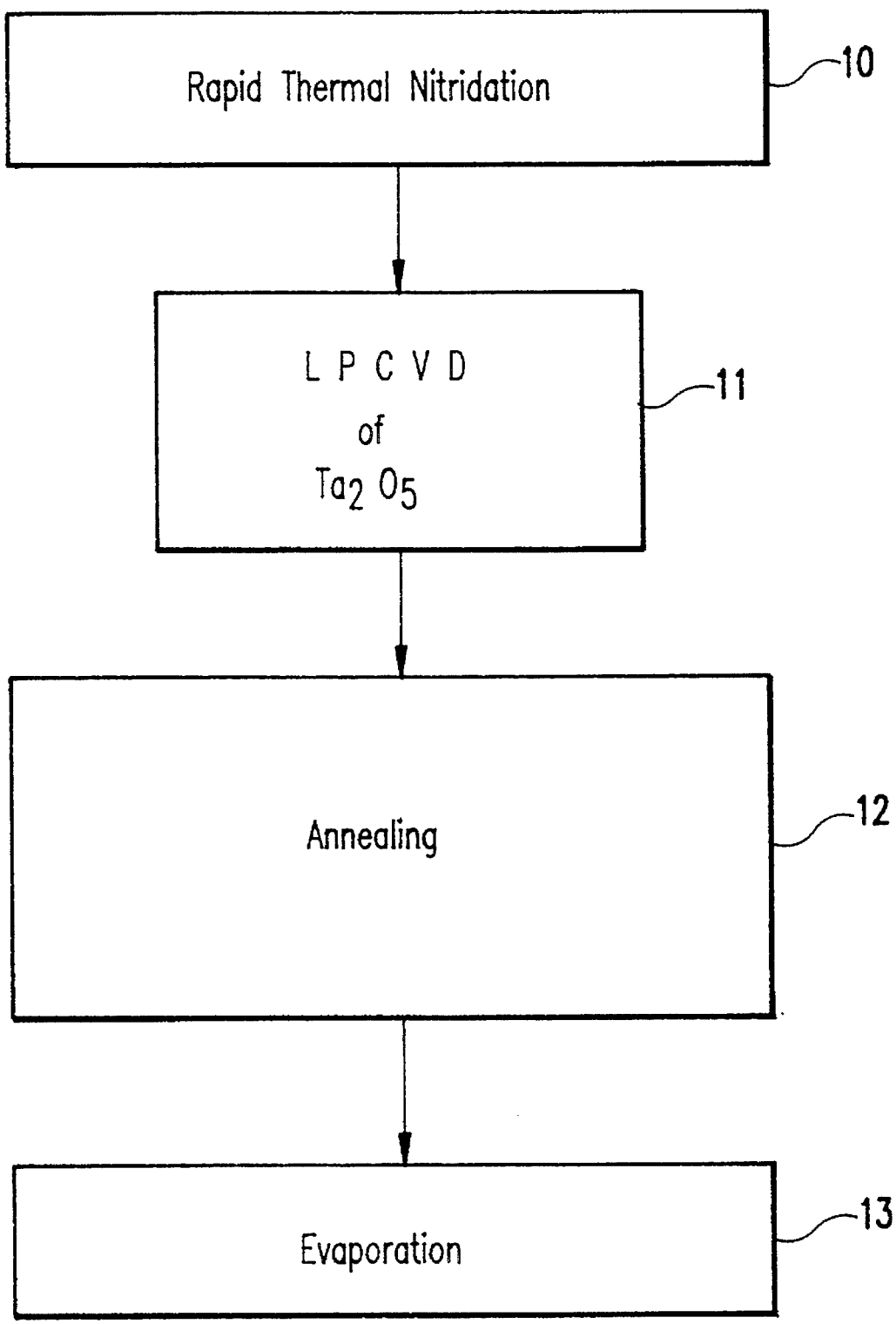
FIG. 1 is a flow chart illustrating the annealing process for both RTO and plasma enhanced oxidation.

Referring now to the drawings, and more particularly to FIG. 1, there is shown a flow chart of the process according to a preferred embodiment of the invention. A p-type silicon substrate is first prepared by rapid thermal nitridation (10 . 11Å) in step 10. This rapid thermal nitridation step is to form a thin nitride film to prevent oxidation of the silicon substrate (n- or p-type) during subsequent oxidation annealing steps. Then a thin film of $Ta_2O_5$ is applied to the substrate by low pressure chemical vapor deposition (LPCVD) using $Ta(OEt)_5+O_2$ at 460° C. in step 11. For purposes of comparative tests, two samples were prepared following steps 10 and 11. The next step 12 is an oxidation step; however, one sample was annealed using a rapid thermal oxidation (RTO) process and the second sample was annealed using the plasma enhanced oxidation anneal according to the invention. The RTO anneal was carried out at 750° C. with 2000 sccm $O_2$ for 120 seconds. The initial thickness of the $Ta_2O_5$ film was 24.1 nm, and the resulting thickness after oxidation was 22.6 nm. The enhanced plasma anneal according to the invention was carried out with a 95W plasma at 400° C. with 2000 sccm $O_3$+230 sccm $O_2$ at 5 Torr for five minutes. The initial thickness of the $Ta_2O_5$ film was 11.4 nm, and the resulting thickness after oxidation was 9.65 nm. Next, in step 13, 0.76 mm² aluminum dots were evaporated on the front sides of the samples with a backside blanket of aluminum with a forming gas anneal at 400° C. for 30 minutes.

Figure 2:
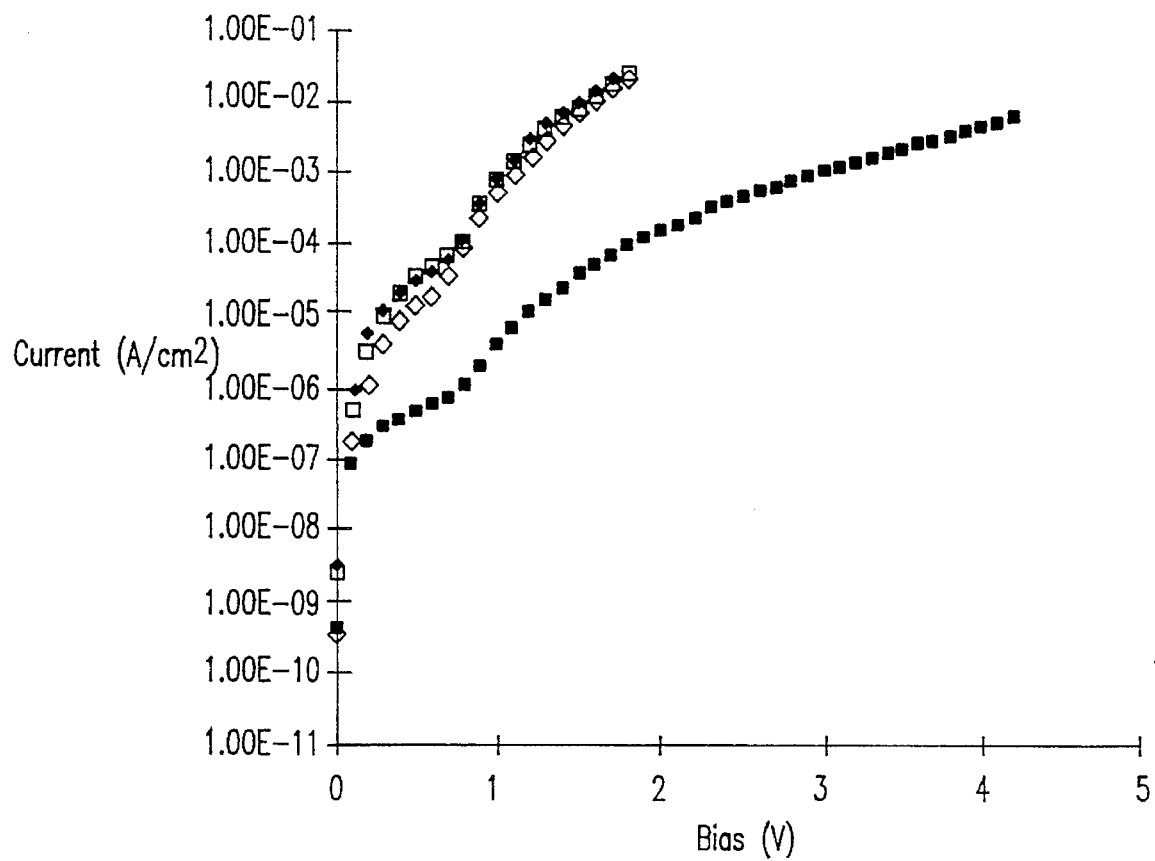
FIG. 2 is a graph depicting the results of the RTO anneal.
Figure 3:
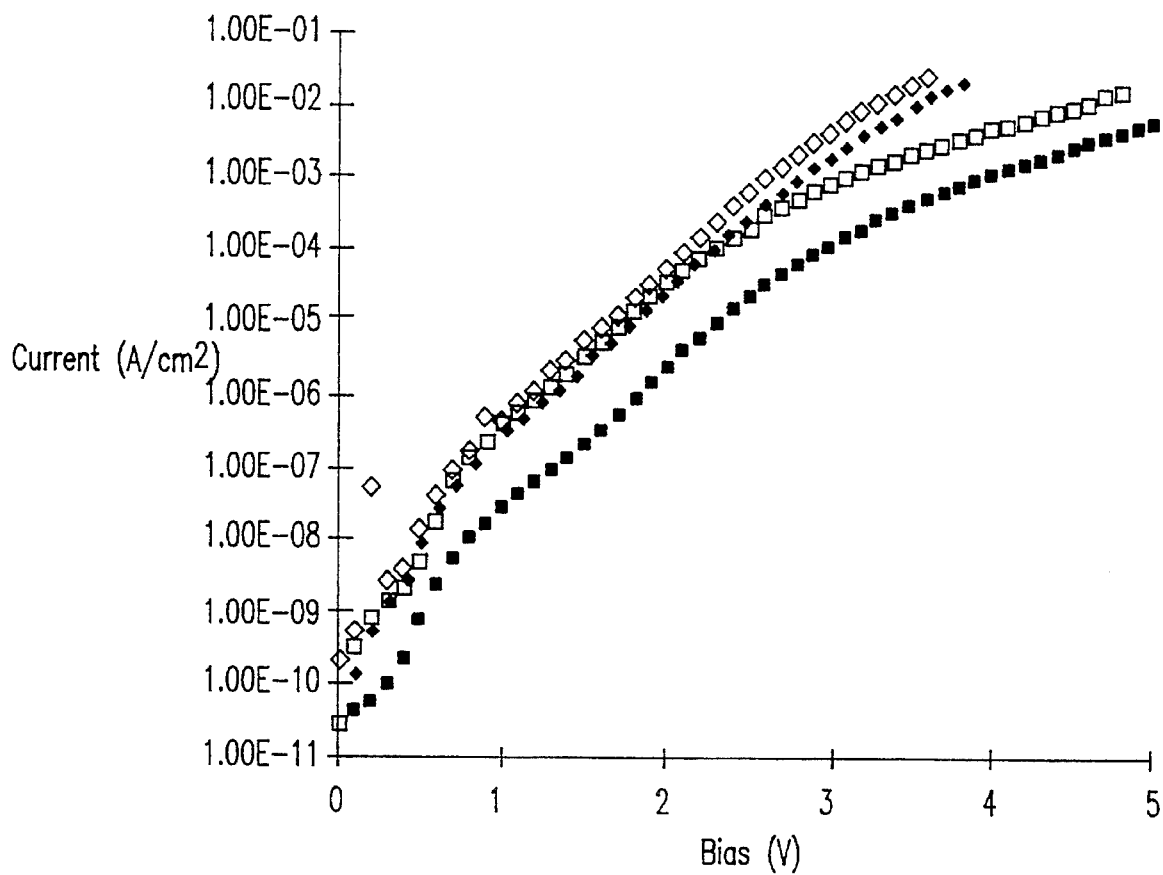
FIG. 3 is a graph depicting the results the enhanced plasma anneal according to the invention.

FIGS. 2 and 3 respectively show the measured results for the two sets of samples with Rapid Thermal Oxidation (RTO) anneal and a plasma ozone anneal for various aluminum dots using MOS IV measurement. As can be seen, despite the fact that the RTO anneal sample was thicker, the leakage was much worse. This is because the high temperatures of the RTO anneal causes oxidation of nearby silicon (polysilicon), thus degrading the dielectric properties. At high temperature oxidation the very thin nitrided surface is not effective in preventing the oxidation.

Figure 4:
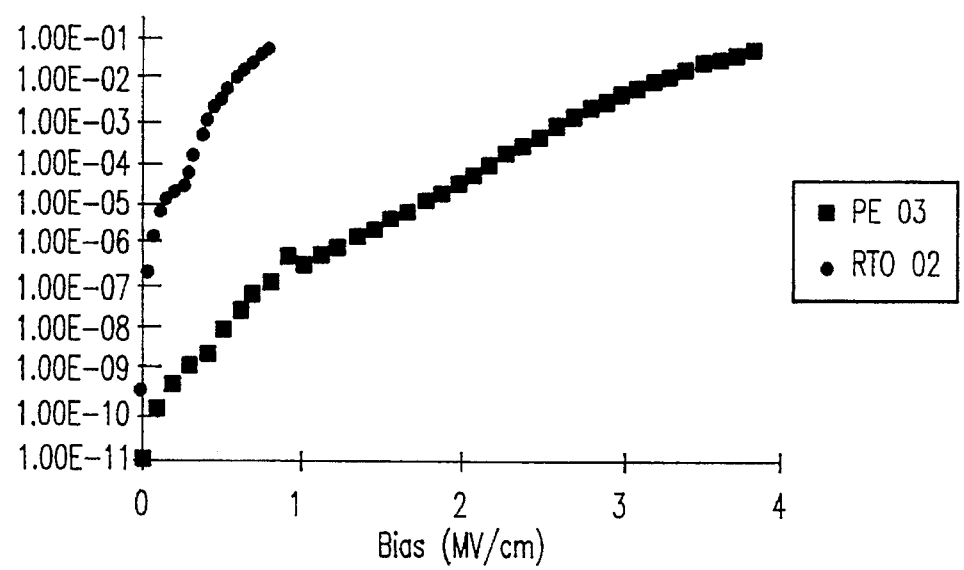
FIG. 4 is a graph of the data from FIGS. 2 and 3 which has been normalized to the same applied field.

In FIG. 4, the data from both samples is normalized to the same applied field (MV/cm). The superiority of plasma ozone anneal is quite clear from this graph. Leakage is $10^{-4}$ $A/cm^2$ at 3 MV/cm for the plasma ozone anneal sample.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of producing high dielectric constant $Ta_2O_5$ thin films comprising the steps of:

subjecting a p- or n-type silicon substrate to a rapid thermal nitridation;

depositing by low pressure chemical vapor deposition (LPCVD) a thin $Ta_2O_5$ film on the nitrided substrate; and annealing the $Ta_2O_5$ film with a low temperature ozone and oxygen enhanced plasma.

2. The method recited in claim 1 wherein the annealing step is performed at approximately 400° C.

3. The method recited in claim 2 wherein the annealing step is performed with 2000 sccm $O_3$ and 230 sccm $O_2$ at 5 Torr for five minutes.

4. The method recited in claim 1 further comprising the step of evaporating metal dots on the annealed $Ta_2O_5$ film to form capacitor structures.

5. The method recited in claim 1, wherein the thin $Ta_2O_5$ film is about 10Å.

\* \* \* \* \*